United States Patent
Wu et al.

(10) Patent No.: US 9,113,548 B2
(45) Date of Patent: Aug. 18, 2015

(54) DEVICE AND METHOD FOR A SIGNAL SHIELD

(75) Inventors: Liang Hua Wu, Shin Dian (TW); Yueh-Lin Chang, Taipei (TW); David C. Miller, Whitehall, PA (US)

(73) Assignee: ARRIS Technology, Inc., Suwanee, GA (US)

( * ) Notice: Subject to any disclaimer, the term of this patent is extended or adjusted under 35 U.S.C. 154(b) by 90 days.

(21) Appl. No.: 13/564,072

(22) Filed: Aug. 1, 2012

(65) Prior Publication Data

US 2013/0083498 A1    Apr. 4, 2013

Related U.S. Application Data

(60) Provisional application No. 61/541,286, filed on Sep. 30, 2011.

(51) Int. Cl.
*H05K 9/00* (2006.01)
*H05K 13/04* (2006.01)

(52) U.S. Cl.
CPC ........... *H05K 9/0032* (2013.01); *Y10T 29/4913* (2015.01); *Y10T 29/4987* (2015.01)

(58) Field of Classification Search
CPC .................... B65D 2543/0037; H05K 1/0218; H05K 9/00; G06F 1/1656

USPC .......... 174/350–397, 520–565; 220/526, 740; 361/818

See application file for complete search history.

(56) References Cited

U.S. PATENT DOCUMENTS

| | | | | |
|---|---|---|---|---|
| 3,234,318 | A * | 2/1966 | Van Lieshout et al. | 174/374 |
| 4,066,837 | A * | 1/1978 | Miura | 174/366 |
| 4,384,165 | A * | 5/1983 | Loving et al. | 174/355 |
| 5,988,391 | A * | 11/1999 | Tsubono | 206/701 |
| 6,320,121 | B1 * | 11/2001 | Honeycutt et al. | 174/384 |
| 7,067,734 | B2 * | 6/2006 | Abe et al. | 174/359 |
| 7,259,969 | B2 * | 8/2007 | Zarganis et al. | 361/800 |

* cited by examiner

*Primary Examiner* — Adrian S Wilson
*Assistant Examiner* — Izak Baranowski
(74) *Attorney, Agent, or Firm* — Lori Anne D. Swanson (57) ABSTRACT

Disclosed herein is a radio frequency shield device that includes, an outer cover having one or more displacement protrusions extending from an outer cover bottom surface and one or more cover fasteners, an inner cover positioned inside the outer cover, wherein at least a portion of the inner cover is deflected downward by the displacement protrusions, and a plurality of fence walls having one or more fence fasteners for interlocking with the cover fasteners, wherein the inner cover is positioned at least partially over the fence walls to form at least one of a primary seal and secondary seal.

19 Claims, 5 Drawing Sheets

DEVICE AND METHOD FOR A SIGNAL SHIELD

FIELD OF THE INVENTION

The device and method for a signal shield relates to the field of electrical shielding.

BACKGROUND OF THE INVENTION

Generally, various types of electrical components and signals generated therefrom can be adversely affected by exposure to various radio signals and electrical fields that produce electro-magnetic radiation (EMR). Undesirable EMR is considered Electro-Magnetic Interference (EMI), aka Radio Frequency Interference (RFI)). EMI can damage electrical components and/or interfere with signals generated or received by the electrical components. In contrast, desirable EMR is used to establish electrical and/or magnetic signals.

As an electronic device often contains both desirable and undesirable sources of EMR, in order to protect some electronic components from EMI and/or enclose other electronic components to prevent attenuation of desired EMR, a Faraday cage can be utilized. A Faraday cage, often referred to as a Radio Frequency (RF) shield, can be used to enclose a specific electronic component to minimize the effects of EMI on electrical components enclosed therein. When an RF shield is exposed to an exterior source of EMI, the RF shield isolates the electric wave portion of the EMI about the exterior of the cage, while the cage attenuates the magnetic wave portion that passes through the cage, thereby reducing the strength of the EMI field experienced by the electronic component. Likewise, an RF shield can be used to maintain the field strength of a desirable EMR that is being emitted from within the RF shield.

An RF shield typically includes a shield fence secured to a Printed Wiring Board (PWB) (aka Printed Circuit Board). The shield fence is covered (i.e., capped) by an outer shield cover, thereby forming an enclosed and protected area. Various methods of securing the shield cover to the shield fence have been used. In large part, these methods have included numerous drawbacks and limitations. For example, the shield cover can be soldered to the shield fence, except when a volatile gas or heat sensitive components are being enclosed, due to the heat generated during the soldering process. Further, the failure rate of soldering can be significant, and in the event of failure, solder cannot be removed and re-applied because of delamination. Other methods have included providing a shield cover with extended walls, along with a wide gutter along the bottom of the shield fence, at the circuit board juncture, for receiving therein the edges of the shield cover walls. This method requires a large gutter thickness for an interference fit with the shield cover. Due to standard manufacturing tolerance limitations, gaps would inherently exist at one or more points along the interconnection.

Yet another method utilizes a plurality of slots in the shield cover which align with a plurality of twist-lock protrusions from the walls of the shield fence. This method requires precision placement of the shield cover to align with each of the slots, along with the need for rotating each of the protrusions to fasten the shield cover to the shield fence. In addition, the inherent tendency of metal to fracture upon twisting can result in one or more of the protrusions being broken off during assembly. Further, the aforementioned methods often require the RF fence to have taller walls to accommodate the installation methods, and therefore the RF shield will have an unnecessarily larger volume, thereby increasing undesirable moding and reducing performance of shielded components.

As can be ascertained from the above discussion, the aforementioned methods are often expensive and complicated to implement during manufacturing and are often found wanting in terms of performance and reliability. Accordingly, it is desired that a device and method be provided that overcomes one or more of the aforementioned drawbacks and/or one or more other drawbacks.

BRIEF SUMMARY OF THE INVENTION

In at least one embodiment, the device and method for a signal shield relates to a radio frequency shield device comprising, an outer cover having one or more displacement protrusions extending from an outer cover bottom surface and one or more cover fasteners, an inner cover positioned inside the outer cover, wherein at least a portion of the inner cover is deflected downward by the displacement protrusions, and a plurality of fence walls having one or more fence fasteners for interlocking with the cover fasteners, wherein the inner cover is positioned at least partially over the fence walls to form at least one of a primary seal and secondary seal.

In another embodiments, the device and method for a signal shield relates to a method of providing a radio frequency shield comprising, at least partially covering a shield inner cover with a shield outer cover, the shield outer cover including an outer cover bottom surface, deflecting at least a portion of the shield inner cover under a bias of one or more displacement protrusions extending from the outer cover bottom surface, providing a shield perimeter wall having a top portion opening defining a sealing perimeter, at least partially sealing the sealing perimeter with the shield inner cover and shield outer cover, wherein the sealing includes biasing the deflected shield inner cover against the sealing perimeter to form a primary seal, and securing the shield outer cover to the perimeter wall under the bias of the deflected shield inner cover against the sealing perimeter.

In still another embodiment, the device and method for a signal shield relates to a radio frequency shield device comprising, a plurality of fence walls situated to provide a perimeter wall extending substantially vertically from a printed wiring board, a plurality of ledges extending from top fence portions of the fence walls, wherein the ledges are substantially perpendicular to the fence walls, a sealing perimeter formed by the ledges, an outer cover having a plurality of outer cover walls extending downward from an outer cover top portion, a plurality of displacement protrusions extending from an outer cover bottom surface of the outer cover an inner cover having a plurality of inner cover walls extending downward from an inner cover top portion and sized to fit at least partially over the perimeter wall and at least partially inside the outer cover, wherein the inner cover is positioned inside the outer cover and the inner cover top portion is deflected by the displacement protrusions, and wherein the inner cover includes an inner cover bottom surface that is placed over the sealing perimeter. The radio frequency shield device further includes, one or more cover fasteners situated on the outer cover walls, and one or more fence fasteners situated on the fence walls for interlocking with the cover fasteners to secure the inner cover bottom surface substantially against the sealing perimeter to form a primary seal and an at least one of an enclosed and substantially enclosed interior area, wherein Electro-Magnetic Interference that is at least one of received by and emitted from the interior area, is at least one of isolated and attenuated.

In still yet another embodiment, the device and method for a signal shield relates to a radio frequency shield device comprising, a plurality of fence walls situated to provide a perimeter wall extending substantially vertically from a printed wiring board, a plurality of ledges extending from top fence portions of the fence walls, wherein the ledges are substantially perpendicular to the fence walls, and a sealing perimeter formed by the ledges. The radio frequency shield device further includes, an outer cover having a plurality of outer cover walls extending downward from an outer cover top portion, a plurality of displacement protrusions extending from an outer cover bottom surface of the outer cover, an inner cover having a plurality of inner cover walls extending downward from an inner cover top portion and sized to fit at least partially over the perimeter wall and at least partially inside the outer cover, wherein the inner cover is positioned inside the outer cover and the inner cover top portion is deflected by the displacement protrusions, and wherein the inner cover includes an inner cover bottom surface that is placed over the sealing perimeter. In addition, the radio frequency shield device includes, one or more cover fasteners situated on the outer cover walls, and one or more fence fasteners situated on the fence walls for interlocking with the cover fasteners to secure the inner cover bottom surface substantially against the sealing perimeter to form a primary seal and an at least one of an enclosed and substantially enclosed interior area, wherein Electro-Magnetic Interference that is at least one of received by and emitted from the interior area, is at least one of isolated and attenuated.

BRIEF DESCRIPTION OF THE DRAWINGS

Embodiments of the device and method for a signal shield are disclosed with reference to the accompanying drawings and are for illustrative purposes only. The device and method for a signal shield is not limited in its application to the details of construction or the arrangement of the components illustrated in the drawings. The device and method for a signal shield is capable of other embodiments or of being practiced or carried out in other various ways. In the drawings.

DETAILED DESCRIPTION OF THE PREFERRED EMBODIMENT

Figures 1, 2:
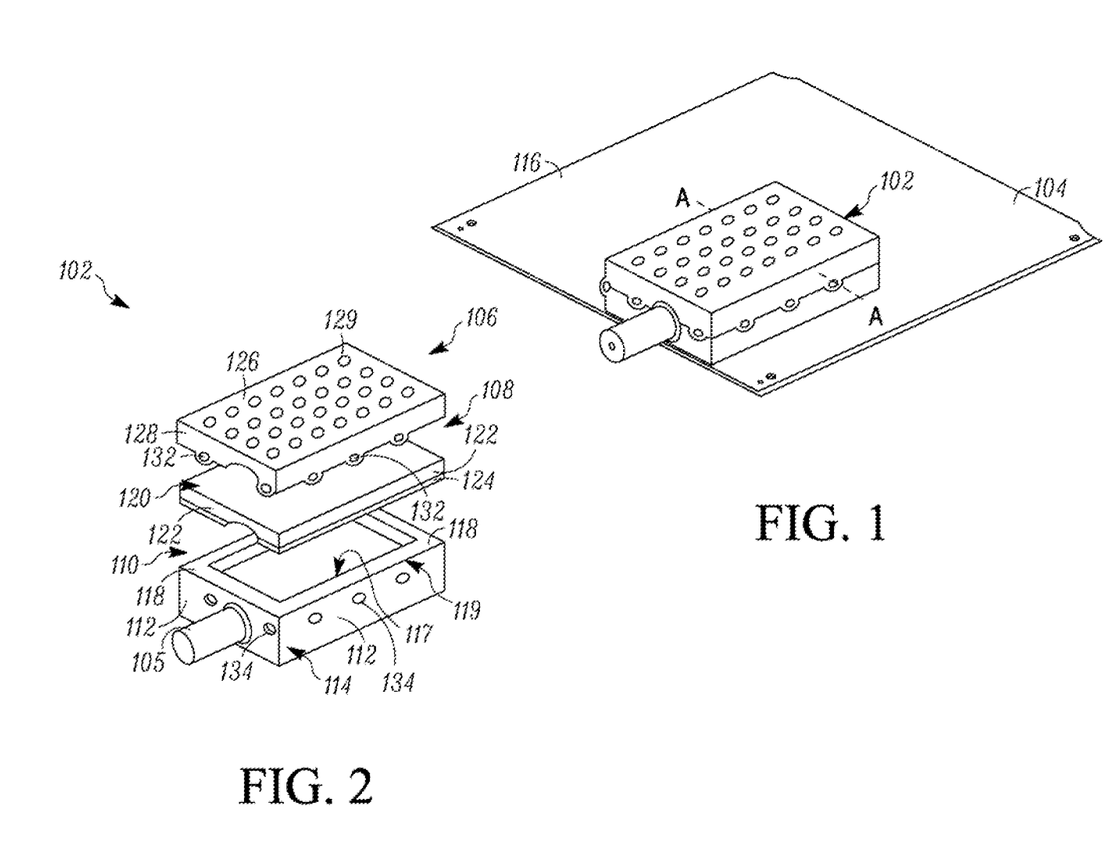
FIG. 1 is a perspective view of an exemplary RF shield device mounted on a printed wiring board.
FIG. 2 is an exploded perspective view of the RF shield device of FIG. 1.
Figure 3:
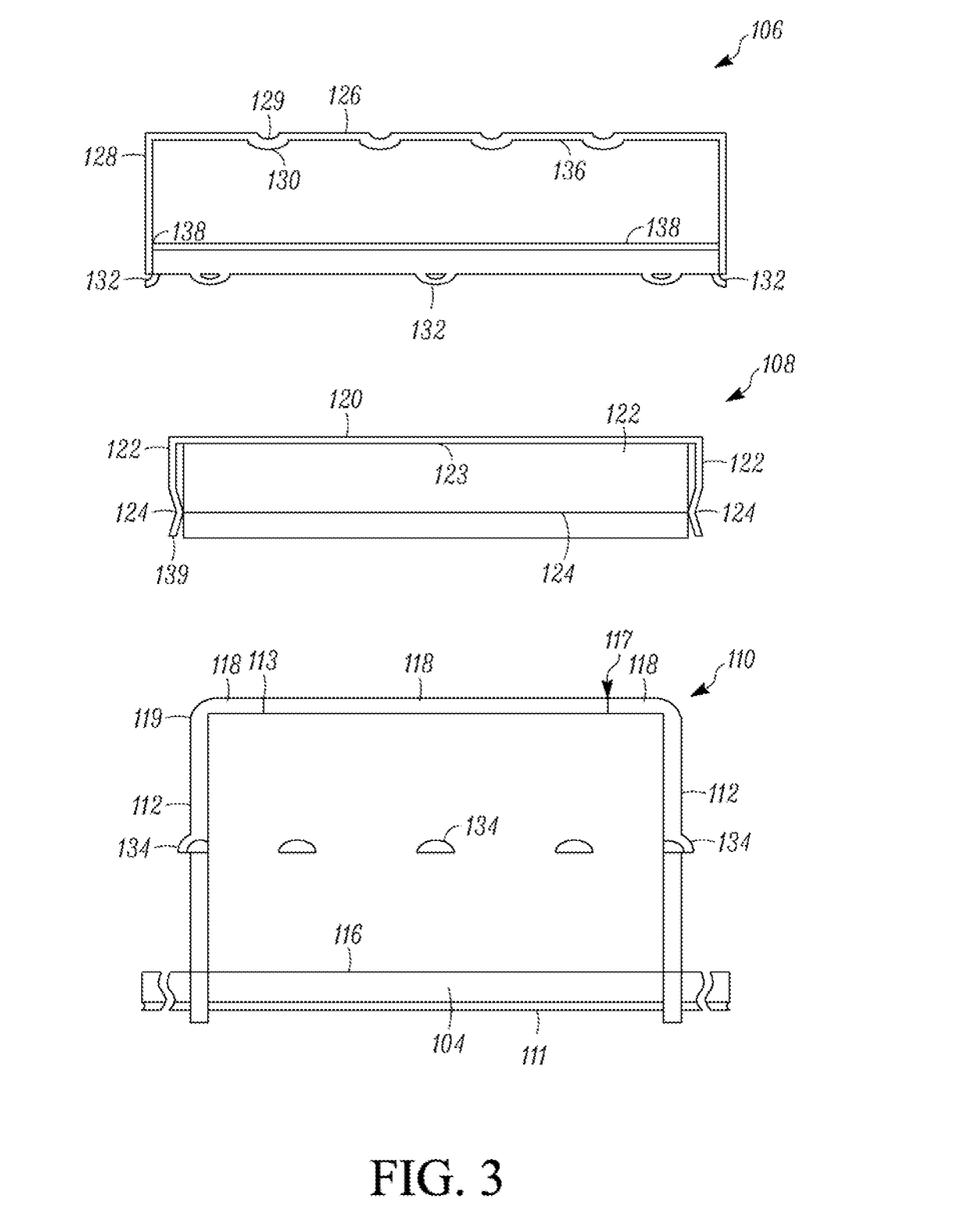
FIG. 3 is an exploded section view taken along line A-A of FIG. 1.

Referring to FIG. 1, an exemplary RF shield device 102 is shown mounted on an exemplary Printed Wiring Board (PWB) (e.g., printed wiring assembly, circuit board, etc.) 104. FIGS. 2 and 3 provide an exploded perspective view of the device 102 and an exploded section view taken along line A-A of FIG. 1, respectively. The device 102 includes an outer cover 106, an inner cover 108, and a shield fence 110. The fence 110 includes a plurality of vertical fence walls 112 contiguously connected end-to-end to form a perimeter wall 114. The fence 110 is configured to extend in a vertical direction from the PWB surface 116, with the fence 110 being substantially contiguous with the PWB 104. The PWB 104 includes a metallic PWB layer 111 extending between the mounting positions of the perimeter walls 114 to provide an uncovered partial enclosure for one or more components (discussed below) and/or signals for which shielding is desired. Additionally, the fence walls 112 each include a ledge 118 that extends inwardly from a top fence portion 119 of each of the fence walls 112. The ledges 118 in some embodiments extend perpendicular or substantially perpendicular to the fence walls 112, although in some other embodiments, the ledges 118 can extend at various other angles relative to the fence walls 112, such as between about 45 degrees and about 135 degrees. The ledge 118 includes a ledge fulcrum 113 (inner edge) and serves to provide a sealing perimeter 117 about the ledge 118 for receiving the inner cover 108, wherein the juncture of each ledge 118 with another ledge 118 is at least partially rounded about the sealing perimeter 117 (as seen in FIG. 2). For exemplary purposes, the fence 110, as depicted in FIGS. 1 and 2, also includes a cable connector 105 extending therefrom, such as can be present when the device 102 and PWB 104 are employed in an exemplary application, for example when implemented as (or as part of) a cable modem. It is to be understood that one or more of numerous connectors can be included with the fence 110, or no connector can be provided.

The inner cover 108 includes an inner cover top portion 120 for abutting the ledges 118 and providing a primary seal 121 about the sealing perimeter 117. Additionally, the inner cover 108 includes a plurality of inner cover walls 122 configured to cover and overlap at least a portion of the fence walls 112 when installed, particularly the top fence portion 119. The inner cover walls 122 can include an inner (inwardly-extending) protrusion portion 124 that is positioned to bias at least a portion of the inner cover walls 122 against the fence walls 112 to provide a secondary seal 142 along the fence 110 when the inner cover 108 is positioned over the fence 110. In at least some embodiments, the inner cover 108 includes a planar inner cover top portion, wherein the inner cover top portion does not extend past the ledges 118 to form the inner cover walls 122.

The inner cover 108 is secured to the fence 110 by the outer cover 106. The outer cover 106 is shaped to fit substantially over the inner cover 108 and at least a portion of the fence 110. The outer cover 106 includes an outer cover top portion 126 and a plurality of outer cover walls 128. The outer cover top portion 126 includes one or more dimples 129 that form displacement protrusions 130 on an opposite side (their underside). As discussed further below, the displacement protrusions 130 exert pressure on the inner cover 108 to cause a deflection that establishes the primary seal 121 at the interface of the inner cover bottom surface 123 and the ledge 118.

Although FIGS. 1-4 depict an exemplary uniform array of displacement protrusions 130, the quantity, size, and placement of the displacement protrusions 130 can vary to accommodate other factors, for example, the configuration of the fence walls 112 and the sealing perimeter 117. In at least some embodiments, the displacement protrusions 130 can be configured to accommodate additional fence walls located within a perimeter wall of outer fence walls. The outer cover 106 is configured to be secured to the fence 110 using a plurality of fasteners, which in at least some embodiments, can be secured without the assistance of a tool. More particularly, in at least some embodiments, the outer cover walls 128 include a plurality of protrusions, such as cover latches 132 as shown that are configured to be matingly received by a plurality of protrusions, such as fence latches 134. Using the mating configuration, the outer cover 106 can be pushed down over the inner cover 108 and onto (and partially over) the fence 110, thereby maintaining the primary seal.

With the covers 106, 108 installed, the device 102 provides an enclosed or substantially enclosed interior area 135. In this regard, Electro-Magnetic Interference (EMI) that is at least one of received by and emitted from the interior area, is isolated and attenuated. More particularly, when the device 102 is exposed to an exterior source of Electro-Magnetic Interference, the electric wave portion of the EMI is at least partially isolated (i.e. reflected) at the exterior surface of the device 102, and the magnetic wave portion of the EMI that passes through the exterior of the device 102 is at least partially attenuated (i.e., absorbed), thereby reducing the strength of the EMI field experienced by the interior area 135. Likewise, when the source of Electro-Magnetic Interference is situated inside the device 102, the electric wave portion of the EMI is at least partially isolated at the interior surface of the device 102, and the magnetic wave portion of the EMI that passes through the interior surface of the device 102 is at least partially attenuated, thereby reducing the strength of the EMI field that is emitted from the device 102. Further, when desirable electro-magnetic radiation (EMR) exists in the interior area 135, the device 102 can serve to contain the EMR, thereby maintaining higher signal strength to achieve increased performance.

In at least some embodiments, the enclosing is intended to be complete, while in other embodiments the enclosing can be intentionally incomplete with an opening to provide various desired characteristics. The interior area 135 can include a component 137, such as a transceiver, microprocessor, radio, etc., or another system and/or sub-system for which the shielding is desired.

Although not readily visible in the figures, the outer cover 106, inner cover 108, and fence 110 can each include four walls (walls 112, 122, 128) to form a rectangle, while other embodiments can include greater or fewer walls to form numerous other shapes and sizes. In addition, although dimples 129 are shown on the outer cover top portion 126 resulting in displacement protrusions 130, the displacement protrusions 130 can be provided without the dimples 129 by using one or more of various methods, such as integrally forming the displacement protrusions 130 on an outer cover bottom surface 136.

Referring still to FIG. 3, the inner cover top portion 120 can be flat or substantially flat when not installed, such that the inner cover top portion 120 is perpendicular to at least a portion of the inner cover walls 122. Similarly, the outer cover top portion 126 is also flat or substantially flat, with exception to the dimples and/or displacement protrusions 130. In other embodiments, the outer cover 106 and inner cover 108 can include a variety of shapes and dimensional interrelations.

Figure 4:
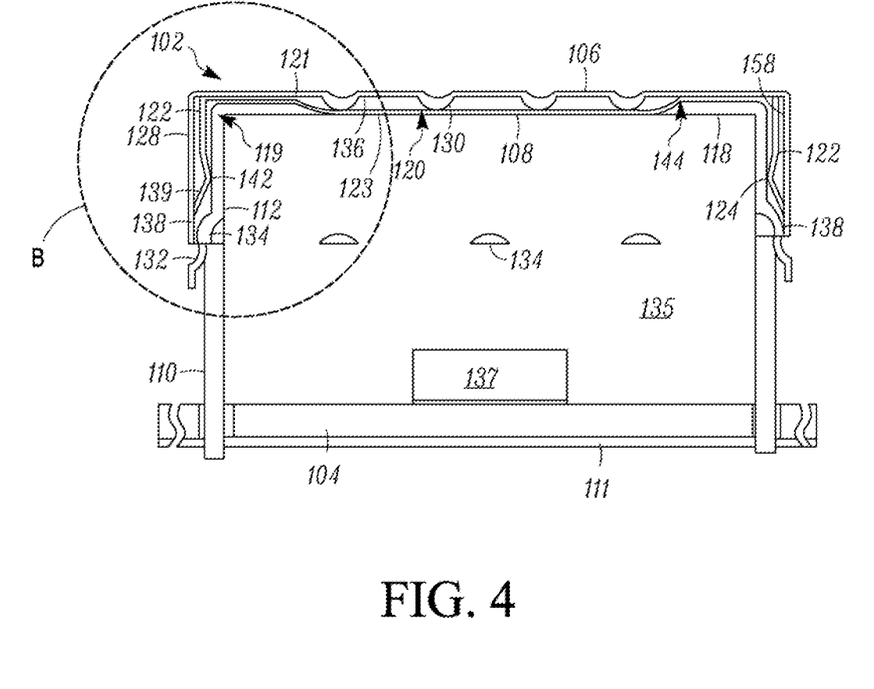
FIG. 4 is a section view taken along line A-A of FIG. 1.

In accordance with at least some exemplary methods, the inner cover 108 is inserted into the outer cover 106 prior to capping the fence 110. As seen in FIGS. 3 and 4, the inner cover 108 is inserted into the outer cover 106 until one or more tab protrusions 138 included on inwardly-facing surfaces of the outer cover walls 128 receive and secure inner cover wall bottom portions 139 of the inner cover 108. The tab protrusions 138 are positioned such that when the inner cover wall bottom portions 139 are positioned thereon, the inner cover top portion 120 at least partially abuts the displacement protrusions 130. The abutment causes at least a portion of the inner cover top portion 120 to deflect into an at least partially convex shape to accommodate the protrusions 130.

To facilitate the deflection, the inner cover 108 can be comprised of one or more flexible substrates, for example a metal flat spring (e.g., phosphor bronze, cold rolled steel). The inner cover 108 can include two or more pieces (separately or integrally formed) designed to each shield against the same or different types of signals and fields. Additionally, the outer cover 106 can be comprised of a material that has a rigidity that exceeds that of the inner cover 108, such as a rigid plastic composition, to encourage the resultant deflection. As discussed further below, the positioning and height of the displacement protrusions 130 along the outer cover top portion 126, and the flexural modulus of the material used for the inner cover 106 can substantially dictate the extent of the inner cover 106 deflection, and the resultant performance of the primary seal 121.

Further, in at least some exemplary methods, the outer cover 106 and inner cover 108 can then be placed over the fence 110 to form the primary seal 121, where the ledges 118 of the fence 110 abut the inner cover 108, and the secondary seal 142, where the fence walls 112 abut the inner protrusion portion 124. As seen in FIG. 4, the deflected portion of the inner cover top portion 120 is compressed where abutment occurs with the ledges 118 of the fence 110. In particular, the abutment can first occur at a ledge fulcrum 113 about each of the ledges 118. As the displacement protrusions 130 bias the inner cover 108 downward and the ledges 118 bias upward, further deflection occurs at least at the ledge fulcrum 113 to provide a spring biased, efficient, and effective primary seal 121. In addition, the inner protrusion portions 124 on the inner cover walls 122 are at least partially compressed against the fence walls 112 by one or both of spring bias of the inner cover 108 or the inward force of the outer cover walls 128. These inner protrusion portions 124 thereby provide a substantially contiguous or non-contiguous secondary seal 142. Although the seals 121, 142 are discussed for use in combination to provide multiple seals, in at least some embodiments, only one of the primary seal 121 and the secondary seal 142 are utilized.

To maintain the abutment of the inner cover 108 with the fence 110, the cover latches 132 on the outer cover 106 are configured to engage the fence latches 134 on the fence walls 112. In this manner, the inner and outer covers 108, 106 can easily be secured to the fence 110, providing the primary and secondary seals 121, 142 without the need for expensive, inefficient, and unreliable sealing methods. In addition, the snap-fit provided by the engagement between non-permanent fasteners, such as the cover latches 132 and the fence latches 134, allow for the device 102 to be opened without destruction of any components. This is particularly beneficial if a post-assembly inspection reveals a defect.

By accommodating varied applications, the device 102 includes a broader base of applicability, thereby increasing the uniformity among components used in one or more manufacturing processes. Further, the device 102 can provide a reduced volume over an RF shield device that would otherwise require extended fence walls 112 to accommodate other sealing methods. In this regard, the reduced volume can provide increased performance of the device 102 by the minimization of moding.

As referenced above, the positioning and height of the displacement protrusions 130 relative to the outer cover top portion 126 along with the flexural modulus of the material can substantially dictate the deflection of the inner cover 108. More particularly, an inner cover 108 having a low flexural modulus needs a greater amount of force to install on the fence 110 than an inner cover 108 with a high flexural modulus. The increased force needed to deflect a low flexural modulus can result in undesirable stress on the PWB 104, as well as require the outer cover 106 to have a much lower flexural modulus as well, which can result in an undesirable thickness and/or rigidity. In contrast, an inner cover 108 with a high flexural modulus can lack the necessary resiliency to maintain the primary seal 121 after installation has occurred, or can otherwise be permanently deformed upon installation. In at least some embodiments, the inner cover 108 is comprised of a phosphor bronze material.

In particular, the outer cover 106 is installed against the spring force of the inner cover 108 to a point where the latching of the outer cover 106 with the fence walls 112 can occur. After the cover latches 132 have passed below the fence latches 134, the latches 132, 134 can then engage with each other, as the outer cover 106 is pushed upwards aided by the spring bias created by the inner cover 108 being spring-loaded against the ledges 118. If the flexural modulus of the inner cover 108 is too high, the inner cover 108 would not maintain adequate spring-loading after the outer cover 106 has been latched to the fence walls 112, and therefore the primary seal 121 would not be maintained.

Figure 5:
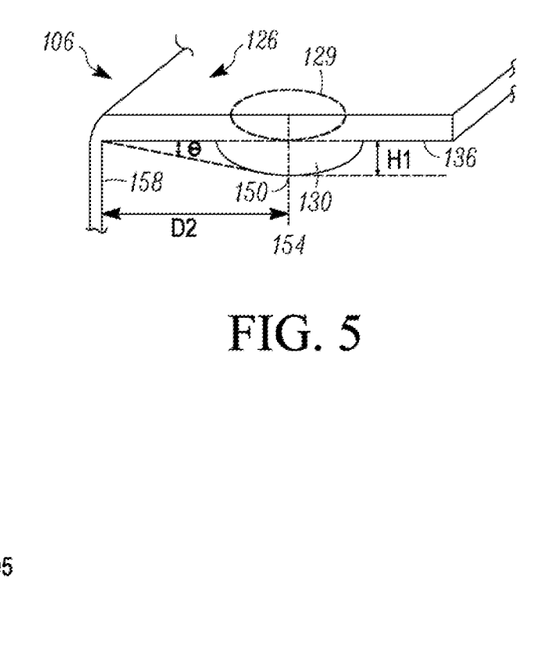
FIG. 5 is a partial perspective view of an outer cover of the RF shield device of FIGS. 1-4.

Referring now to FIG. 5, with regard to the positioning and size of the displacement protrusions 130, these parameters can also affect the performance of the primary seal 121 formed about the sealing perimeter 117. More particularly, if the height H1 of the displacement protrusion 130 (as measured between a protrusion bottom 150 and an outer cover bottom surface 136) positioned adjacent the ledge fulcrum 113, and the distance D1 between a protrusion center axis 154 and the ledge fulcrum 113 is either too great or too small, the device 102 can suffer from the aforementioned issues related to the choice of inner cover material and flexural modulus of the inner cover 108.

In addition to the positioning and sizing of the displacement protrusions 130, the dimensional relationship of the outer cover 106 with the cover latches 132, and the fence 110 with the fence latches 134 is also considered. In at least some embodiments, the cover latches 132 are positioned to move past at least a portion of the fence latches 134 (or vice-versa) to allow fastening when the outer cover 106 is installed onto the fence 110. To accommodate this movement, the configuration of the inner cover 108, displacement protrusions 130, and ledge 118 provide for a spring biased compression of the inner cover 108 to a position that allows the outer cover 106 to exceed a final resting position for latching. Further, after at least a portion of the cover latches 132 move past the fence latches 134 and are positioned to interlock with the cover latches 132, the outer cover 106 is allowed to rise upwards under the spring bias of the inner cover 108 to fully result in the interlocking of the latches 132, 134. In this position, at least a portion of the spring bias established by the inner cover 108 is maintained to form the primary seal 121 of the inner cover 108 against the ledge fulcrum 113. Additionally, with the cover latches 132 interlocked with the fence latches 134, the outer cover walls 128 can exert pressure against the inner cover walls 122, thereby abutting the inner protrusion portion 124 of the inner cover 108 against the fence walls 112 to establish the secondary seal 142. The secondary seal 142 can thereby function similar to the primary seal 121 by isolating and attenuating EMI that is at least one of received by and emitted from the interior area.

Figure 6:
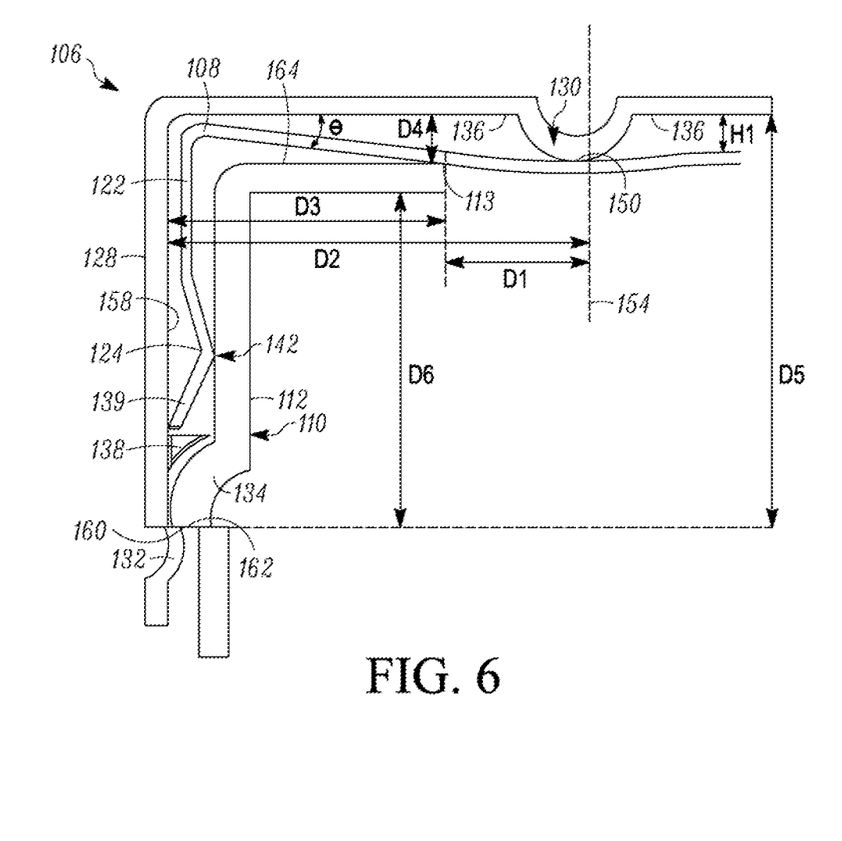
FIG. 6 is a close-up of section B of FIG. 4.
Figure 7:
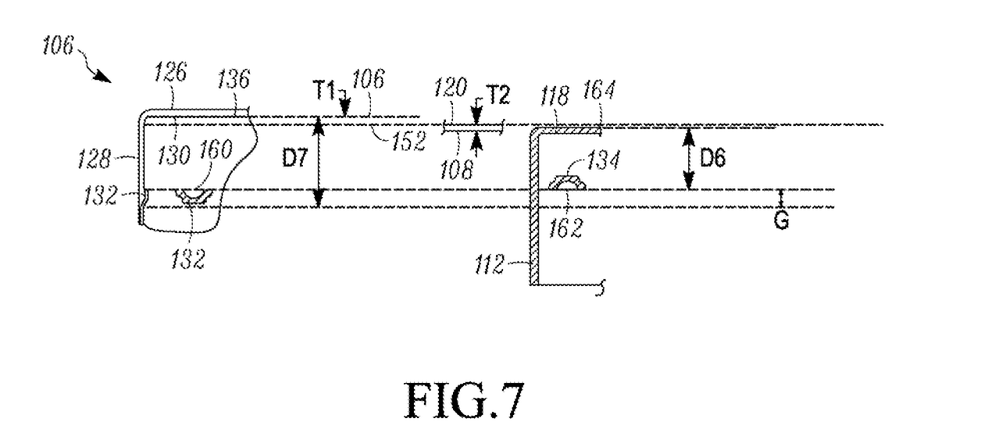
FIG. 7 is an exploded partial view of the RF shield device of FIGS. 1-4 illustrated to exemplify various dimensional relationships.

Continuing to refer to FIG. 5 and further referencing FIGS. 6 and 7, the dimensional relationships of the aforementioned elemental components can vary substantially to accommodate various applications and designs. As such, a plurality of methods can be used to find dimensional variables using a selection of chosen fixed values. An exemplary method is discussed with reference to FIGS. 5, 6, and 7, using exemplary fixed values to find desired variables. The exemplary parameters are provided and calculated to allow for the fastening of the latches 132, 134 and the creation of at least one of the primary seal 121 and secondary seal 142. Referring to FIG. 5, in at least some embodiments, a distance D2 (the distance between a protrusion center axis 154 and an outer cover inside edge 158) can be chosen to equal about 8.9 mm and the height H1 of the displacement protrusion 130 can be chosen to equal about 0.7 mm. Using these selected parameters, the angle θ is calculated to equal about 4.50 degrees. Referring now to FIG. 6, utilizing the angle θ and a selected distance D3 (the distance between the ledge fulcrum 113 and the outer cover inside edge 158), the distance D4 can be calculated to equal about 0.427 mm. The distance D4 is the distance between the outer cover bottom surface 136 and the ledge fulcrum 113. It is at distance D4 that the inner cover 108 first deflects due to abutment with the ledge fulcrum 113, thereby creating the spring bias which requires downward force to be exerted to continue installation of the outer cover 106, as discussed above. In addition, when the thickness of the inner cover 108 is subtracted from the distance D4, the designer is provided maximum distance value that the outer cover 106 can be moved downward. Further in consideration of the distance D4, to allow for the outer cover 106 be moved downward until interlocked with the fence 110 and then sprung upward, the distance D5 (distance between a cover protrusion top surface 160 and the outer cover bottom surface 136) minus the distance D6 (distance between a fence protrusion bottom surface 162 and a ledge top surface 164), when interlocked, is intended to be less than the distance D4.

Referring to FIG. 7, various exemplary parameters are discussed below to illustrate a configuration of the dimensional relationships for the device 102. For example, a thickness T1 of the displacement protrusions 130 can be selected to equal about 0.1697 mm, along with a thickness T2 of the inner cover 108 equal to about 0.0697 mm. Further, a distance D7 (distance between the outer cover bottom surface 136 and the cover protrusion top surface 160) can be selected to equal about 6.7303 mm and the distance D6 can be selected to equal about 6.5197 mm. Using these chosen parameters the gap G, which is the maximum distance the outer cover can be depressed after initial contact of the inner cover 108 with the ledge fulcrum 113, can be calculated. More particularly, subtracting D6, T1, and T2 from D7 provides a gap G of about 0.0288 mm. Referencing the distance D4 in FIG. 6, the gap G would be desired to be less than the distance D4 (as discussed above).

Further, as discussed above, the designer can select which parameters of the device 102 shall be fixed values and then calculate the remaining variable values. In this regard, a large degree of freedom is provided to the designer to accommodate various design limitations or requirements, such as the height of a fence wall. As such, the aforementioned examples encompass only a few possible configurations of the plethora of possible configurations.

In addition, as discussed above, the device 102 can include a plurality of walls extending from the outer cover, inner cover, and fence, as shown in FIG. 2. It is to be understood that although multiple walls may not have been shown in one or more of the figures, the aforementioned primary seal 121 and secondary seal 142 can be formed to substantially or completely surround the perimeter wall 114 of the fence 110. As such, the various aforementioned components such as ledge fulcrums 113 and numerous protrusions are understood to extend as necessary around the device perimeter to substantially or completely complete the seals 121, 142. The completeness of the seals 121, 142 relates to the device's ability to shield EMI. Further, it is to be understood that the device 102 is not limited to the use of shielding EMI and can be utilized as a shield against other sources of signals and fields, in addition to or in place of EMI. Further, although the mechanism for covering the fence disclosed above provides a simple, efficient, and more robust new shield device, in at least some embodiments, the aforementioned device and methods can be utilized to retrofit existing inferior RF shield components.

It is specifically intended that the device and methods for electrical component shielding not be limited to the embodiments and illustrations contained herein, but include modified forms of those embodiments including portions of the embodiments and combinations of elements of different embodiments as come within the scope of the following claims.

We claim:

1. A radio frequency shield device comprising:
    an outer cover having one or more displacement protrusions extending from an outer cover bottom surface and one or more cover fasteners,
    an inner cover positioned inside the outer cover, wherein at least a portion of the inner cover is deflected downward by the displacement protrusions; and
    a plurality of fence walls having one or more fence fasteners for interlocking with the cover fasteners,
    wherein the inner cover is positioned at least partially over the fence walls to form at least one of a primary seal and secondary seal, the inner cover including inner cover walls having an inner protrusion portion for abutment with the fence walls to form the secondary seal.

2. The device of claim 1, wherein one or more of the fence walls are secured to a printed wiring board.

3. The device of claim 2, wherein coupling of the fence walls, printed wiring board, inner cover, and outer cover, provide an enclosed or substantially enclosed interior area.

4. The device of claim 3, wherein Electro-Magnetic Interference that is at least one of received by and emitted from the interior area, is isolated and attenuated.

5. The device of claim 1, further including ledges that extend from a top portion of the fence walls, wherein the ledges provide a sealing perimeter for receiving at least a portion of the inner cover to form the primary seal.

6. The device of claim 5, wherein the deflected portion of the inner cover extends downward in a convex shape that abuts the sealing perimeter when the inner cover is secured onto the fence walls.

7. The device of claim 5, wherein the inner cover includes a metal flat spring.

8. The device of claim 5, wherein the ledges extend inward towards each other in a direction that is substantially perpendicular to the top portion of the fence walls.

9. The device of claim 5, wherein a spring bias between the outer cover and the ledge is provided by the deflection of the inner cover.

10. The device of claim 9, wherein the spring bias maintains the primary seal after the cover fasteners and fence fasteners have been interlocked.

11. The device of claim 1, wherein the inner cover walls include inner cover wall bottom portions for engaging tab protrusions that extend from the outer cover walls, to secure the inner cover to the outer cover.

12. The device of claim 5, wherein an array of the displacement protrusions is extended along the outer cover bottom surface, and wherein the array is shaped to substantially conform to the shape of the sealing perimeter.

13. The device of claim 5, wherein the displacement protrusions are convex in shape.

14. A method of providing a radio frequency shield comprising:
    at least partially covering a shield inner cover with a shield outer cover, the shield outer cover including an outer cover bottom surface;
    deflecting at least a portion of the shield inner cover under a bias of one or more displacement protrusions extending from the outer cover bottom surface;
    providing a shield perimeter wall via a plurality of fence walls having a top portion opening defining a sealing perimeter;
    at least partially sealing the sealing perimeter with the shield inner cover and shield outer cover, wherein the sealing includes biasing the deflected shield inner cover against the sealing perimeter to form a primary seal;
    at least partially covering the plurality of fence walls with the shield inner cover, the shield inner cover including inner cover walls having an inner protrusion portion;
    at least partially sealing the inner cover to the plurality of fence walls, wherein sealing includes abutting the inner protrusion portion with the plurality of fence walls to form a secondary seal; and
    securing the shield outer cover to the perimeter wall under the bias of the deflected shield inner cover against the sealing perimeter.

15. The method of claim 14, further including securing the perimeter wall to a printed wiring board to provide an enclosed or substantially enclosed interior area.

16. The method of claim 15, further including at least partially isolating Electro-Magnetic Interference that is at least one of received at and emitted from the interior area.

17. The method of claim 14, further including at least partially attenuating Electro-Magnetic Interference that is at least one of received at and emitted from the interior area.

18. A radio frequency shield device comprising:
    a plurality of fence walls situated to provide a perimeter wall extending substantially vertically from a printed wiring board, a plurality of ledges extending from top fence portions of the fence walls, wherein the ledges are substantially perpendicular to the fence walls;
    a sealing perimeter formed by the ledges;
    an outer cover having a plurality of outer cover walls extending downward from an outer cover top portion;
    a plurality of displacement protrusions extending from an outer cover bottom surface of the outer cover;
    an inner cover having a plurality of inner cover walls extending downward from an inner cover top portion and sized to fit at least partially over the perimeter wall and at least partially inside the outer cover,
    wherein the inner cover is positioned inside the outer cover and the inner cover top portion is deflected by the displacement protrusions, and
    wherein the inner cover includes an inner cover bottom surface that is placed over the sealing perimeter;
    one or more cover fasteners situated on the outer cover walls; and
    one or more fence fasteners situated on the fence walls for interlocking with the cover fasteners to secure the inner cover bottom surface substantially against the sealing perimeter to form a primary seal and an at least one of an enclosed and substantially enclosed interior area,
    wherein Electro-Magnetic Interference that is at least one of received by and emitted from the interior area, is at least one of isolated and attenuated,
    an inner protrusion portion of one or more of the inner cover walls for abutting a fence wall of the perimeter wall to form a secondary seal, wherein the inner cover is positioned at least partially over the plurality of fence walls.

19. The device of claim 18, wherein the printed wiring board is configured for a cable modem and a cable connector is provided at the perimeter wall.

* * * * *